(12) United States Patent
Han et al.

(10) Patent No.: US 9,459,315 B2
(45) Date of Patent: Oct. 4, 2016

(54) TRAY FOR ALIGNING SEMICONDUCTOR PACKAGES AND TEST HANDLER USING THE SAME, AND METHOD OF ALIGNING SEMICONDUCTOR PACKAGES AND TEST METHOD USING THE SAME

(71) Applicant: Samsung Electronics Co., Ltd., Suwon-si (KR)

(72) Inventors: Jong Won Han, Cheonan-si (KR); Sang Il Kim, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 256 days.

(21) Appl. No.: 14/217,911

(22) Filed: Mar. 18, 2014

(65) Prior Publication Data
US 2014/0262928 A1 Sep. 18, 2014

(30) Foreign Application Priority Data
Mar. 18, 2013 (KR) .................. 10-2013-0028588

(51) Int. Cl.
*G01R 31/28* (2006.01)
*H01L 21/673* (2006.01)
*H01L 21/68* (2006.01)

(52) U.S. Cl.
CPC ..... *G01R 31/2893* (2013.01); *H01L 21/67333* (2013.01); *H01L 21/68* (2013.01)

(58) Field of Classification Search
None
See application file for complete search history.

(56) References Cited

U.S. PATENT DOCUMENTS

| 6,029,427 | A  | * | 2/2000 | Freund | H01L 21/67333 206/460 |
|---|---|---|---|---|---|
| 2008/0071409 | A1 | * | 3/2008 | Ahn | G01R 31/2893 700/114 |
| 2008/0157807 | A1 | * | 7/2008 | Kim | G01R 31/2893 324/750.22 |
| 2008/0174299 | A1 | * | 7/2008 | Kim | G01R 31/2867 324/756.07 |
| 2011/0316571 | A1 | * | 12/2011 | Kiyokawa | G01R 31/2891 324/750.16 |
| 2012/0062258 | A1 | * | 3/2012 | Yamada | G01R 31/2887 324/750.16 |
| 2012/0062262 | A1 | * | 3/2012 | Lee | G01R 31/2893 324/757.04 |
| 2013/0181576 | A1 | * | 7/2013 | Shiozawa | H02N 2/0095 310/323.17 |

FOREIGN PATENT DOCUMENTS

| KR | 19960008967 | 3/1996 |
|---|---|---|
| KR | 19960024298 | 7/1996 |
| KR | 0269228 | 7/2000 |
| KR | 1084606 | 4/2001 |
| KR | 0375302 | 2/2005 |
| KR | 0565783 | 11/2005 |
| KR | 20080109226 | 12/2008 |
| KR | 1113710 | 3/2011 |

* cited by examiner

*Primary Examiner* — Melissa Koval
*Assistant Examiner* — Felicia Farrow
(74) *Attorney, Agent, or Firm* — Onello & Mello, LLP

(57) ABSTRACT

A tray for aligning semiconductor packages, a test handler using the same, a method of aligning the semiconductor packages, and a test method using the same include a tray main body comprising a plurality of package pocket portions at which a plurality of semiconductor packages are individually received and an air position-aligning unit coupled to the tray main body. The air position-aligning unit applies air having a preset pressure to the semiconductor package received at the package pocket portion. The semiconductor package is aligned at the package pocket portion.

24 Claims, 9 Drawing Sheets

TRAY FOR ALIGNING SEMICONDUCTOR PACKAGES AND TEST HANDLER USING THE SAME, AND METHOD OF ALIGNING SEMICONDUCTOR PACKAGES AND TEST METHOD USING THE SAME

CROSS-REFERENCE TO RELATED APPLICATIONS

This application claims the priority of Korean Patent Application No. 10-2013-0028588, filed on Mar. 18, 2013, in the Korean Intellectual Property Office, the contents of which is incorporated herein by reference.

FIELD

The inventive concept relates to a tray for aligning semiconductor packages, a test handler using the same, a method of aligning the semiconductor packages, and a test method using the same, and more particularly to a tray for aligning semiconductor packages, a test handler using the same, a method of aligning the semiconductor packages, and a test method using the same, in which the semiconductor package is free from defective seating.

BACKGROUND

During a semiconductor manufacturing process, if a semiconductor package is completely assembled, individual semiconductor packages are transferred to undergo a process, for example, described herein. A semiconductor manufacturing process requires that many semiconductor packages are transferred at the same time or many semiconductor packages are precisely aligned.

A semiconductor integrated circuit provided in the form of a chip on a semiconductor wafer is reprocessed in the form of a package, where the chip is protected from an external shock, while experiencing a series of packaging processes. The completely processed semiconductor package undergoes a package test process in which an electric final test is performed prior to delivery to a user. A tester where various measuring devices are mounted to a computer, and a handler for automatically transferring and connecting the semiconductor package to the tester are used, and such facilities are collectively referred to a test handler.

In brief, a test handler operates as follows. If a customer tray (C-tray) receiving the semiconductor packages is loaded at an entrance of a loading part, then the semiconductor packages on the customer tray are transferred to and received again on the buffer tray (B-tray) by a picking head or the like. Then the semiconductor packages received on the buffer tray are received again in a test tray (T-tray) suitable for the test by the picking head or the like. Thereafter, the test tray is transferred to a test site and thus the semiconductor packages undergo the test.

Here, the test handler may need to transfer the semiconductor packages from the customer tray (C-tray) to the buffer tray. Conventionally, the buffer tray provided with a pocket portion for guiding an outskirt of the package has been used to transfer and align the semiconductor packages, and an inner wall forming the pocket portion is inclined so that the semiconductor package can enter the pocket portion along an inclined surface when being received in the pocket portion even though the semiconductor package goes slightly awry.

However, if many semiconductor packages are transferred and received at a high speed, the semiconductor package may sometimes go awry from the pocket portion. In this case, the whole test handler is suspended, and after the semiconductor packages are manually received in a proper position of the pocket portion or removed, the test handler is restarted, thereby lowering productivity.

Also, the pocket portion of the buffer tray has to be manufactured to have a larger size than the semiconductor package in order to prevent the semiconductor package from getting jammed with respect to an outskirt size tolerance, and therefore, a problem may occur where the semiconductor may go awry with respect to a predetermined position within the pocket portion of the buffer tray.

As above, the buffer tray is described by way of example. However, a conventional tray for aligning the semiconductor packages has problems in that the facilities are suspended to take manual measures since it has no automatic compensation function even though the semiconductor package goes awry with respect to the pocket portion. It is difficult to normally load the semiconductor package at a fine pitch since difficulties can arise in order to provide precise position alignment needed corresponding to the semiconductor package.

SUMMARY

The inventive concept provides a tray for aligning semiconductor packages, a test handler using the same, a method of aligning the semiconductor packages, and a test method using the same, in which the semiconductor package that may sometimes go awry while the semiconductor packages are individually transferred can be aligned to a proper position, and degree of precision in the proper position of the package can be more improved than that of a conventional case.

According to an aspect of the inventive concept, there is provided a tray for aligning semiconductor packages. The tray comprises a tray main body comprising a plurality of package pocket portions at which a plurality of semiconductor packages are individually received; and an air position-aligning unit coupled to the tray main body. The air position-aligning unit applies air having a preset pressure to the semiconductor package received at the package pocket portion. The semiconductor package is aligned at the package pocket portion.

In some embodiments, the air position-aligning unit comprises an air channel in the tray main body that communicates with the package pocket portion and is provided in the tray main body to connect with an air injection hole for injecting the air; and an air pump that supplies the air to the air channel.

In some embodiments, the air injection hole is provided at a center region of a bottom wall of the tray main body.

In some embodiments, the tray further comprises a diffusion groove which is recessed from a surface about the air injection hole at the bottom wall, the diffusion groove communicating with the air injection hole, the diffusion groove having a cross-section area that is reduced it extends upward.

In some embodiments, each air injection hole is connected to one air channel.

In some embodiments, the air position-aligning unit further comprises a controller which controls the air pump to continuously supply air by a preset time to the air channel when the semiconductor packages to be tested are loaded into the tray main body, so that the semiconductor packages can vibrate.

In some embodiments, the tray main body comprises: a body portion which comprises the package pocket portion and a receiving groove formed in a lower portion of the package pocket portion; and a package supporter which is arranged in the receiving groove of the body portion, and supports the semiconductor package received in the package pocket portion, and the air injection hole is formed in the package supporter.

In some embodiments, the package supporter comprises: a package supporting frame which is relatively movably coupled to the body portion; and a shock-absorbing member, which is interposed between the body portion and the package supporting frame and absorbs a shock applied to the package supporting frame.

In some embodiments, the plurality of package pocket portions each comprises an inclined surface on an inner wall of the tray main body forming the package pocket portion so that a cross-section area of each package pocket portion gradually narrows as it extends from a top opening to a bottom surface.

In some embodiments, the tray further comprises a buffer tray which is transferred from a customer tray loaded with the semiconductor packages to be tested and that receives the semiconductor packages.

According to an aspect of the inventive concept, there is provided a test handler comprising a tray for aligning semiconductor packages, in which the semiconductor packages are received. The tray comprises a tray main body which comprising a plurality of package pocket portions in which semiconductor packages are individually received; and an air position-aligning unit which is connected coupled to the tray main body. The air position-aligning unit applies air having a preset pressure to a semiconductor package received in the package pocket portion so that the semiconductor package can be aligned in the package pocket portion.

In some embodiments, the air position-aligning unit comprises at least one air injection hole in the tray main body; an air channel in the tray main body, the air channel communicating with the at least one injection hole for injecting the air; and an air pump which supplies the air to the air channel so that the semiconductor package can vibrate when the semiconductor packages to be tested are loaded in the tray main body.

In some embodiments, the air injection hole is provided in a center region of a bottom wall of the tray main body forming the package pocket portion.

In some embodiments, the test handler further includes a diffusion groove which is recessed from a surface around the air injection hole of the bottom wall to communicate with the air injection hole, and has a cross-section area getting smaller as going upward.

In some embodiments, the air position-aligning unit further includes a controller which controls the air pump to continuously supply air by preset time to the air channel when the semiconductor packages to be tested are loaded into the tray main body, so that the semiconductor packages can vibrate.

In some embodiments, the tray main body comprises a body portion which comprises the package pocket portion and a receiving groove formed in a lower portion of the package pocket portion; and a package supporter which is arranged in the receiving groove of the body portion, and supports the semiconductor package received in the package pocket portion, and the air injection hole is formed in the package supporter.

In some embodiments, the package supporter comprises: a package supporting frame which is relatively movably coupled to the body portion; and a shock-absorbing member which is interposed between the body portion and the package supporting frame and absorbs a shock applied to the package supporting frame.

In some embodiments, the plurality of package pocket portions each comprises an inclined surface on an inner wall of the tray main body forming the package pocket portion so that a cross-section area of each package pocket portion can get gradually narrower as going from a top opening to a bottom surface.

In some embodiments, the test handler comprises a buffer tray which is transferred from a customer tray loaded with the semiconductor packages to be tested and receives the semiconductor packages.

According to another aspect of the inventive concept, there is provided a method of aligning semiconductor packages, comprising receiving the semiconductor packages in the tray for aligning the semiconductor packages, which comprises a plurality of package pocket portions in which the semiconductor packages are individually received; and applying air having preset pressure to the semiconductor package received in the package pocket portion so as to align the semiconductor package.

In some embodiments, applying the air having the preset pressure comprises continuously applying air by preset time through an air injection hole formed in a tray main body provided with the package pocket portion of the tray for aligning the semiconductor packages so as to communicate with the package pocket portion so that the semiconductor packages can vibrate.

In some embodiments, applying the air having the preset pressure comprises ascertaining whether there is a semiconductor package that goes awry with respect to a preset position of the package pocket portion; and applying air to an air injection hole communicating with the package pocket portion which has to receive the package pocket portion going awry from the preset position, so that the semiconductor package can vibrate.

According to another aspect of the inventive concept, there is provided a test method for semiconductor packages, comprising aligning the semiconductor packages in the tray for aligning the semiconductor packages, which comprises a plurality of package pocket portions in which the semiconductor packages are individually received; and transferring the aligned semiconductor packages to a test tray, wherein aligning the semiconductor package comprises: receiving the semiconductor package in the tray for aligning the semiconductor packages; and applying air having preset pressure to the semiconductor package received in the package pocket portion so as to align the semiconductor package.

In some embodiments, applying the air having the preset pressure comprises continuously applying air by preset time through an air injection hole formed in a tray main body provided with the package pocket portion of the tray for aligning the semiconductor packages so as to communicate with the package pocket portion so that the semiconductor packages can vibrate.

In some embodiments, applying the air having the preset pressure comprises ascertaining whether a semiconductor package goes awry with respect to a preset position of the package pocket portion; and applying air to an air injection hole communicating with the package pocket portion which has to receive the package pocket portion going awry from the preset position, so that the semiconductor package can vibrate.

According to another aspect of the inventive concept, there is provided a test handler, comprising: a buffer tray that aligns a plurality of semiconductor packages to be tested. The buffer tray comprises a tray main body having a plurality of package pocket portions in which the semiconductor packages are individually received; and tan air position-aligning unit coupled to the tray main body, the air position-aligning unit applying air to each of the semiconductor packages to be received in the package pocket portions for aligning semiconductor packages in the package pocket portions. The test handler further comprises a loader unit that transfers the semiconductor packages from the buffer tray to a test tray.

In some embodiments, the air position-aligning unit comprises: an air channel in the tray main body that communicates with the package pocket portion and is provided in the tray main body to connect with an air injection hole for injecting the air; and an air pump that supplies the air to the air channel.

In some embodiments, the air position-aligning unit further comprises a controller which controls the air pump to continuously supply air by preset time to the air channel when the semiconductor packages to be tested are loaded into the tray, main body, so that the semiconductor packages can vibrate.

In some embodiments, the tray main body comprises: a body portion which comprises the package pocket portion and a receiving groove formed in a lower portion of the package pocket portion; and a package supporter which is arranged in the receiving groove of the body portion, and supports the semiconductor package received in the package pocket portion, and the air injection hole is formed in the package supporter.

In some embodiments, the plurality of package pocket portions each comprises an inclined surface on an inner wall of the tray main body forming the package pocket portion so that a cross-section area of each package pocket portion can get gradually narrower as going from a top opening to a bottom surface.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE INVENTION

Figure 1:
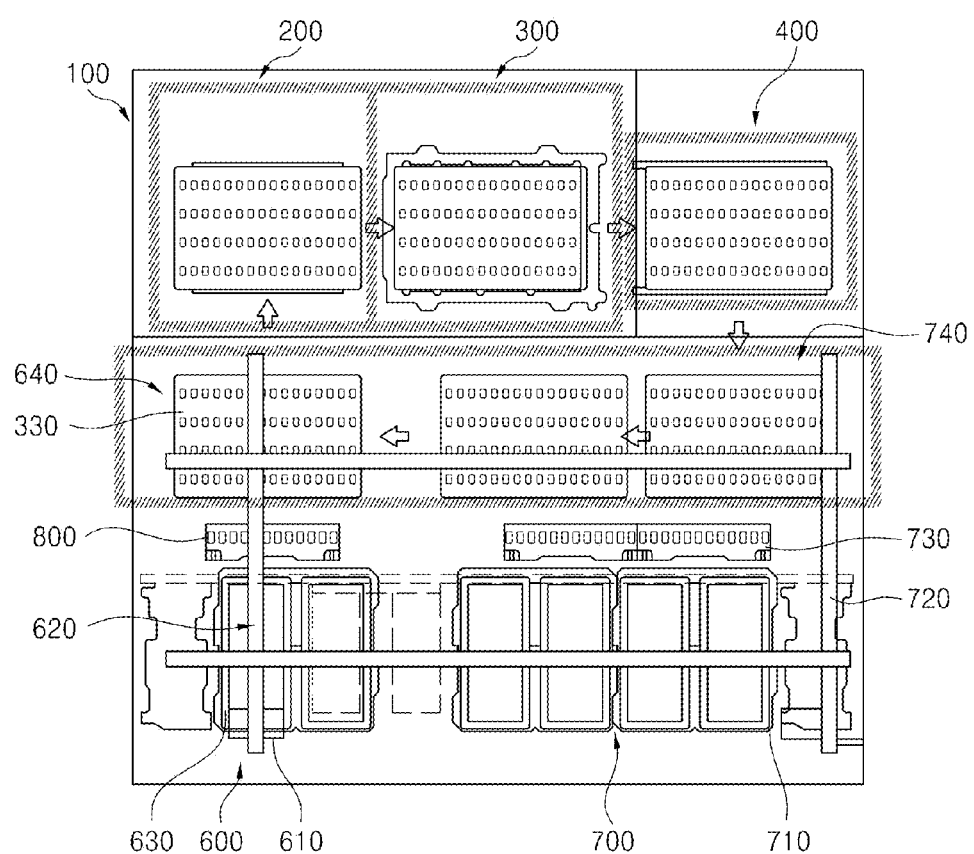
FIG. 1 is a schematic plan view of a test handler according to an embodiment of the present inventive concept.

Specific structural or function descriptions of embodiments according to the present inventive concept disclosed in this specification or application are illustrated just for explaining embodiments according to the present inventive concept. The embodiments according to the present inventive concept can be realized in various forms, and have not to be interpreted as limited to the embodiments explained in the present specification or application.

The embodiments according to the present inventive concept may be variously changed and have many forms, and therefore the present specification or application will be described in detail with exemplary embodiments illustrated in the drawings. However, this is not to limit the embodiments of the present inventive concept to a certain disclosed form, and it has to be understood that the embodiments involve all the modifications, equivalents or substitutes without departing from the idea and technical range of the present inventive concept.

The terms such as 'first' and/or 'second', etc. can be used in explaining various elements, but the elements have not to be limited by the foregoing terms. The above terms have to be given only for distinguishing one element from another element, and for example, a first element may be named a second element, and vice versa, without departing from the scope of the present inventive concept.

If it is described that a certain element is "connected" or "coupled" to a different element, it may be directly connected to or coupled to the different element, but it has to be also understood that an additional element may be interposed between the above elements. On the other hand, if it is described that a certain element is "directly connected" or "directly coupled" to a different element, it has to be understood that no element may be interposed between the elements. Other representations for explaining a relationship between the elements, e.g., "between ~" and "directly in between ~", "near to ~" and "directly near to", or the like have to be interpreted likewise.

The terms used in the present specification are used just for explaining certain embodiments, and are not intended to limit the present inventive concept. A singular form involves a plural form as long as it is not differently defined in the context. In this specification, it will be appreciated that "comprise", "have" or the like terms are just used for designating the presence of feature, numerals, steps, operations, elements, parts or combinations thereof, without excluding possibility of the presence or addition of one or more features, numerals, steps, operations, elements, parts or combinations thereof.

As long as it is not defined differently, all the terms used herein including technical or scientific terms have the same meaning as those generally understood by a person having an ordinary skill in the art to which the present inventive concept pertains. Also, terms defined in a generally used dictionary have to be interpreted as meaning equivalent to contextual meaning of the related technology, and have not to be interpreted as ideal or excessively formal meaning as long as they are clearly defined in this specification.

Hereinafter, the inventive concept will be described in detail by explaining embodiments of the inventive concept with reference to the attached drawings. Like reference numerals in the drawings denote like elements.

The present inventive concept is applicable to various trays for aligning the semiconductor packages, a test handler using the same, a method of aligning the semiconductor packages and a test method using the same, but for convenience of description, a buffer tray (B-tray) will be described below as the tray for aligning the semiconductor packages.

Figure 2:
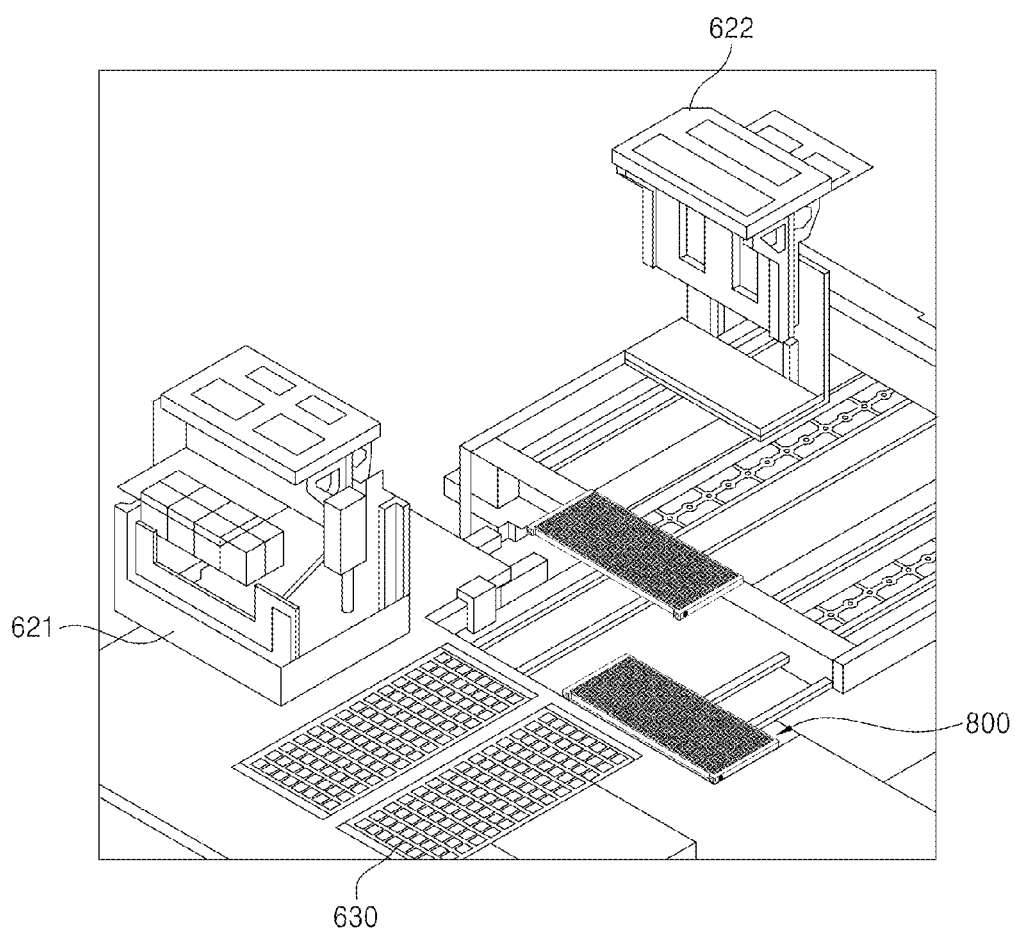
FIG. 2 is a partial perspective view of the test handler of FIG. 1.

FIG. 1 is a schematic plan view of a test handler according to an embodiment of the present inventive concept. FIG. 2 is a partial perspective view of the test handler of FIG. 1.

As shown therein, a test handler for a semiconductor device according to an embodiment of the present inventive concept includes a main body 100, a loader unit 600 for supplying a semiconductor package to be tested, an unloader unit 700 for unloading the semiconductor package of which the test is completed, a soak chamber 200 for preheating or precooking the semiconductor package at a predetermined temperature, a test chamber 300 for testing the semiconductor package loaded on a test tray 330, and an exit chamber 400 for returning the tested semiconductor package to an initial room temperature state.

In this embodiment, the test handler employs a buffer tray 800 as a tray for aligning the semiconductor package to be tested, described in detail herein.

The main body 100 couples with the loader unit 600, the unloader unit 700, the soak chamber 200, the test chamber 300 and the exit chamber 400. The main body 100 can serve as a frame or related structure for supporting the foregoing.

The loader unit 600 includes a loading stocker (not shown), a loading-side set plate 610, and a loading Cartesian robot 620. The loading stocker provided in front of the main body 100 is stocked with the customer trays (C-trays) 630 where many semiconductor packages to be tested are loaded.

The customer trays 630 stocked in the loading stocker are sequentially transferred to the loading-side set plate 610 by a transfer arm (not shown). As shown in FIG. 2, the loading Cartesian robot 620 includes a first picking head 621 and a second picking head 622. The first picking head 621 transfers the semiconductor packages from the customer tray 630 to the buffer tray 800. The second picking head 622 transfers the semiconductor packages from the buffer tray 800 to a test tray 330.

The semiconductor packages are at the buffer tray 800 before being transferred to the test tray 330 because length/breadth pitches of the package pocket portions 812 provided in the customer tray 630 and accommodating the semiconductor packages are generally different from the length/breadth pitches of the package pocket portions 812 provided on the test tray 330 arranged for a test process in a test site. Therefore, if the first picking head 621 directly transfers the semiconductor packages accommodated in the package pocket portion 812 of the customer tray 630 to package pocket portions of the test tray 330, then the pitches between them are not matched and control of the robot is not easy, resulting in a loss in work.

Similar to the loading unit, the unloader unit 700 includes an unloading stocker (not shown), an unloading-side set plate 710, and an unloading Cartesian robot 720. At one side of the loading stocker is provided the unloading stocker where the tested semiconductor packages are sorted in accordance with test results and accommodated in the customer tray 630. Also, the customer trays 630 placed on the unloading-side set plates 710 are also sequentially transferred to the unloading stocker by the transfer arm (not shown).

The unloading Cartesian robot 720 includes a third picking head (not shown) and a fourth picking head (not shown). The third picking head transfers the semiconductor packages from the test tray 330 to an unloading buffer tray 730. The fourth picking head transfers the semiconductor packages from the unloading buffer tray 730 to the customer tray 630. As an alternative to providing a unloading buffer tray 730, an unloader unit may in other embodiments be provided without the unloading buffer tray 730.

In brief, the loading stocker stocked with a plurality of customer trays 630 receiving the semiconductor packages to be tested and the unloading stocker stocked with the customer trays 630 receiving the semiconductor packages tested and sorted according to grades are respectively arranged in front of the main body 100. Further, the loading-side set plate 610 and the unloading-side set plate 710 are respectively arranged on the loading stocker and the unloading stocker as waiting places for loading and unloading the semiconductor packages.

Further, the loading Cartesian robot 620 and the unloading Cartesian robot 720 continuously and repetitively move between the test trays 330 via the customer tray 630 and the buffer tray 800. Thus, the loading Cartesian robot 620 transfers the semiconductor package to be tested from the customer tray 630 to the test tray 330 via the buffer tray 800. The unloading Cartesian robot 720 transfers the tested semiconductor package from the test tray 330 to the customer tray 630 via the unloading buffer tray 730.

The test tray 330 is repetitively circulated while sequentially moving to a waiting region of a loader stage 640 before entering the soak chamber 200. The test tray 330 sequentially moves between soak chamber 200, the test chamber 300, the exit chamber 400. The test tray 330 moves to the unloader stage 740 which is ata region proximal the exit chamber 400, and where the test tray 330 is positioned before moving to the loader stage 640 after exiting the exit chamber 400.

In the loader stage 640, the test tray 330 waits for loading the semiconductor package to be tested. The unloader stage 740 includes a sorting region where the tested semiconductor package waits to be sorted. A buffer region where an empty test tray 330 waits to be supplied to the loader stage 640.

To circulate the test tray 330, the test handler according to an embodiment of the present inventive concept includes a conveyor for circulating the test tray 330 in between the loader stage 640, the soak chamber 200, the test chamber 300, the exit chamber 400 and the unloader stage 740, and further includes a main controller for controlling the conveyor. The soak chamber 200, the test chamber 300 and the exit chamber 400 are provided at a back region of the main body 100.

The test tray 330 loaded with the semiconductor package moves in a direction from the soak chamber 200 to the exit chamber 400. Here, the soak chamber 200 serves to previously heat or cool the test tray 330 loaded with the semiconductor package at a predetermined temperature before transferring the test tray 330 to the test chamber 300.

Further, the exit chamber 400 serves to return the tested semiconductor package from the test chamber 300 to the initial room temperature state.

The test chamber 300 uses a test plate to electrically connect the respectively semiconductor packages loaded on the test tray 330 with test sockets (not shown) of a test board under the test conditions, i.e., under conditions where a high or low temperature is maintained, thereby performing the test.

When the semiconductor packages are transferred and received in the buffer tray 800 from the customer tray 630 receiving the semiconductor packages, a conventional test handler has a known problem where the test handler is suspended to take manual measures since it has no automatic compensation function even in situations where the semiconductor package goes awry with respect to the package pocket portion 812 of the buffer tray 800. In particular, it is difficult to normally load the semiconductor package at a fine pitch since a precise position alignment needed corresponding to the semiconductor package is difficult to attain.

In an embodiment, a buffer tray 800 is provided for aligning the semiconductor packages is configured as follows, and can address and resolve the foregoing problem associated with conventional test handlers.

Figure 3:
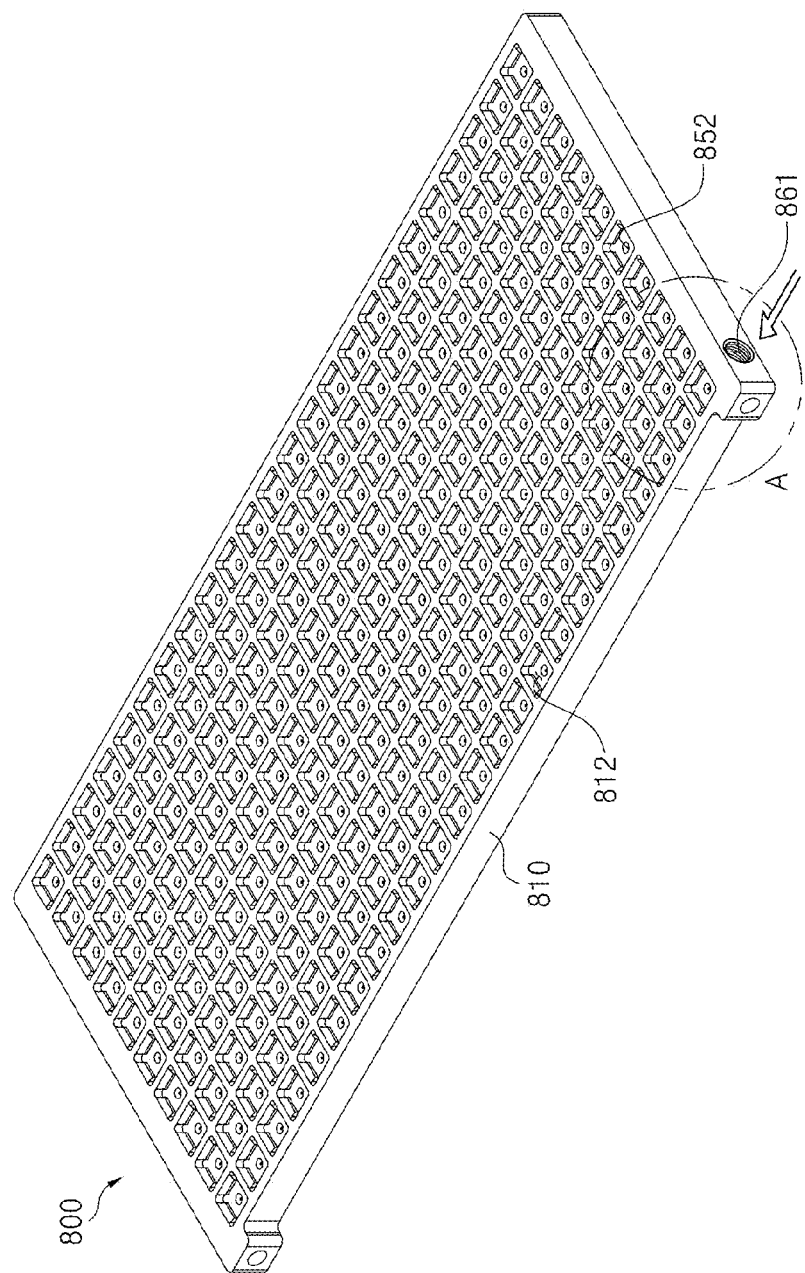
FIG. 3 is a perspective view of a buffer tray used in the test handler of FIG. 1 as a tray for aligning semiconductor packages according to an embodiment of the present inventive concept.
Figure 4:
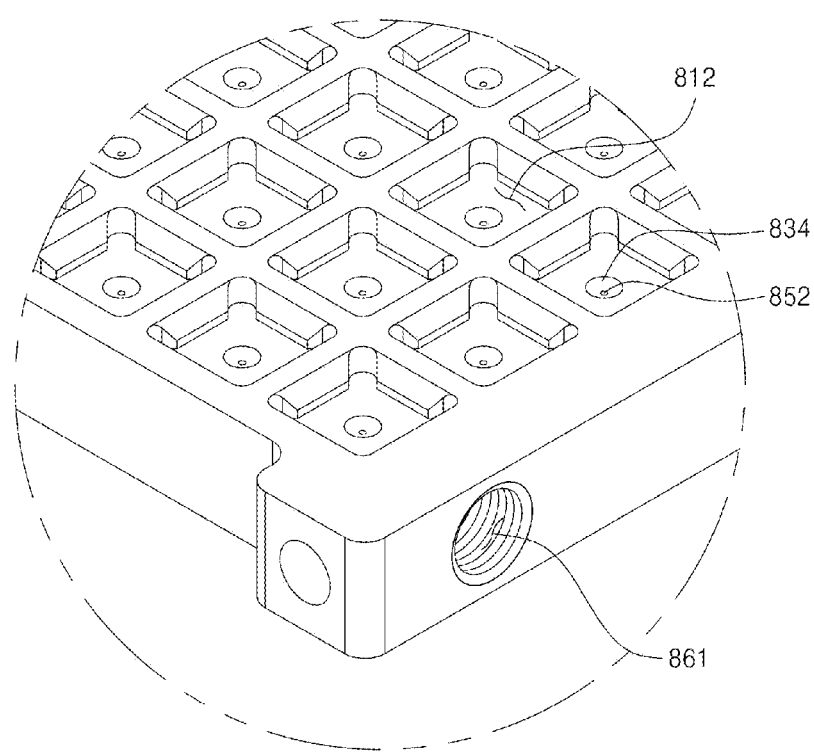
FIG. 4 is an enlarged perspective view of an 'A' region of FIG. 3.
Figure 5:
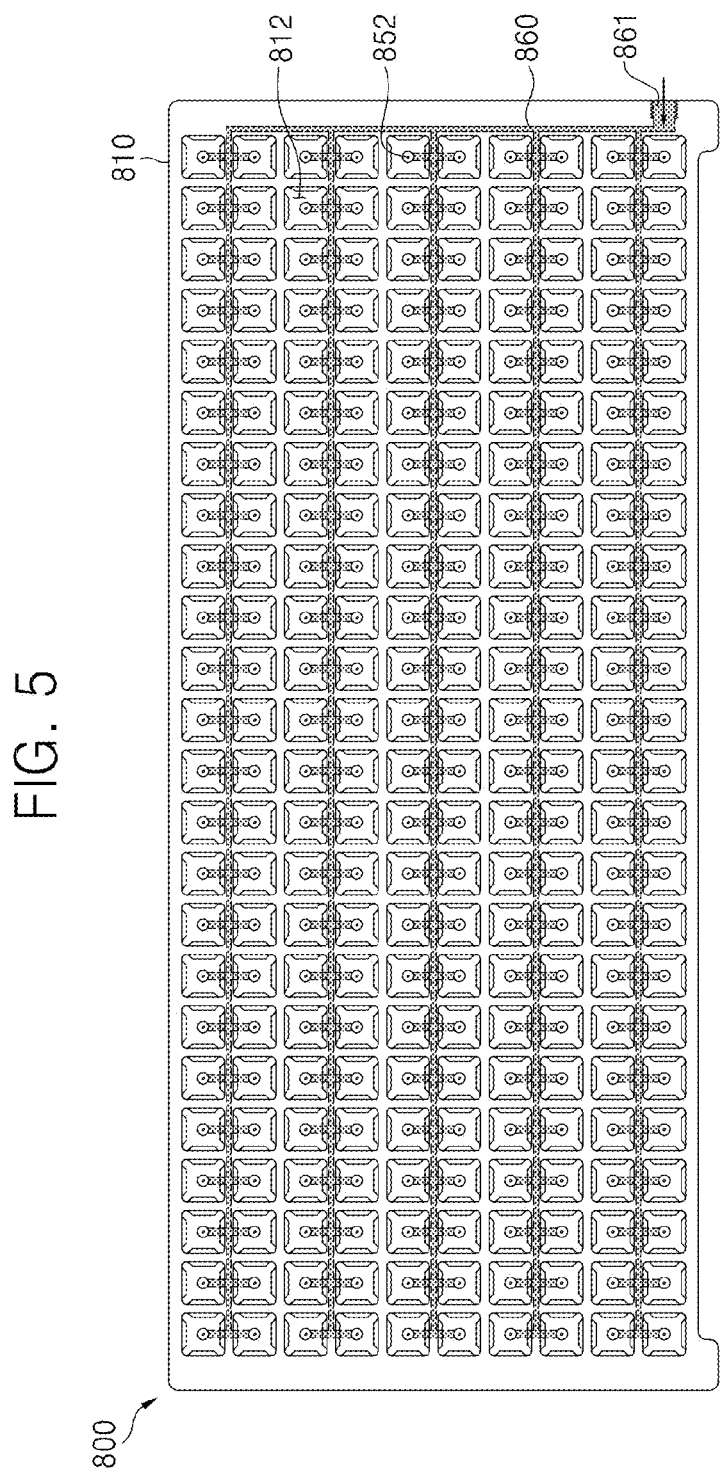
FIG. 5 is a plan view showing an air channel inside the buffer tray of FIG. 3 with a hidden line.
Figure 6:
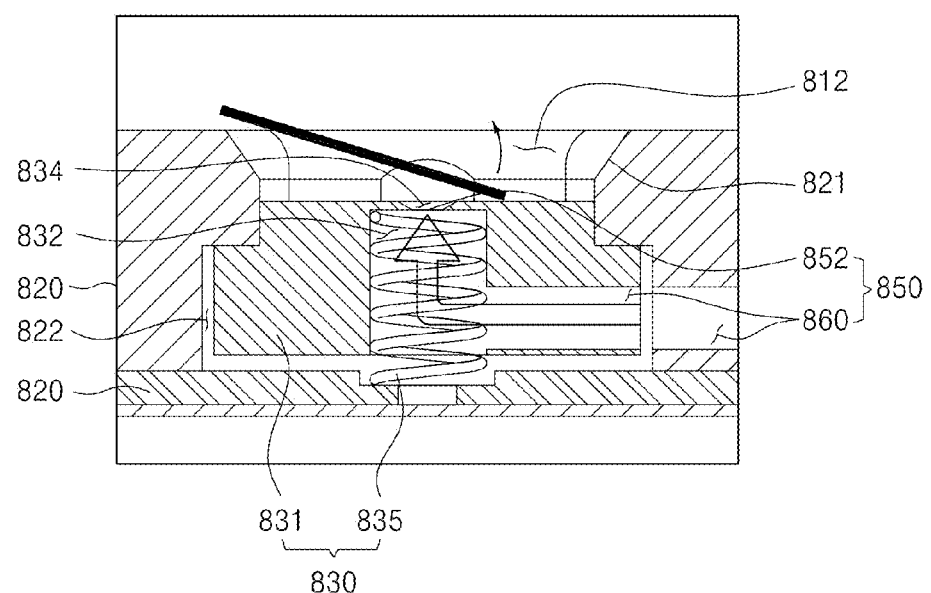
FIG. 6 and FIG. 7 are views illustrating processes of aligning the semiconductor packages vibrated by air in the buffer tray of FIG. 3.
Figure 7:
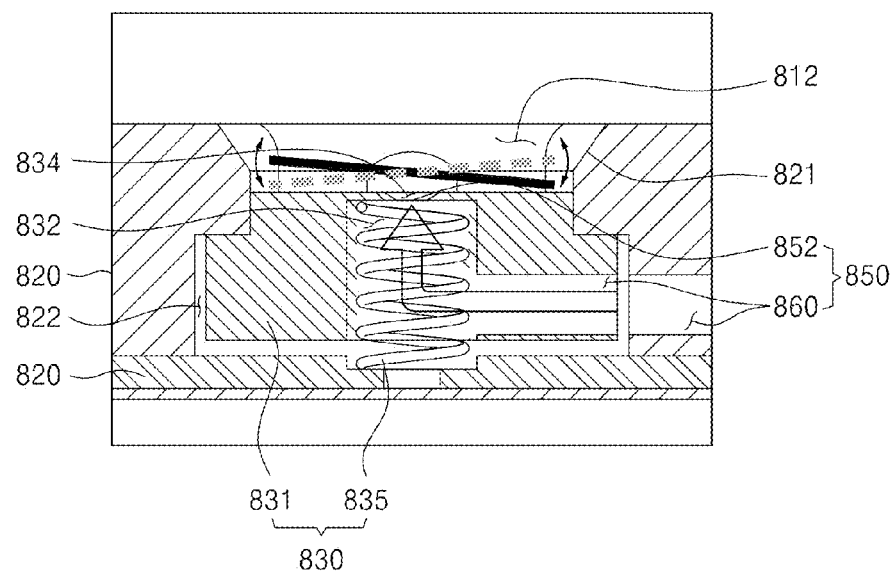

FIG. 3 is a perspective view of a buffer tray 800 used in the test handler of FIG. 1 as a tray for aligning semiconductor packages according to an embodiment of the present inventive concept, FIG. 4 is an enlarged perspective view of an 'A' region of FIG. 3. FIG. 5 is a plan view showing an air channel inside the buffer tray 800 of FIG. 3 with a hidden line. FIG. 6 and FIG. 7 are views illustrating processes of aligning the semiconductor packages vibrated by air in the buffer tray 800 of FIG. 3.

As shown herein, the buffer tray 800 can be used as a tray for aligning semiconductor packages according to an embodiment of the present inventive concept. The buffer tray 800 includes a tray main body 810 having a plurality of package pocket portions 812 at which semiconductor packages are individually received. As shown in FIGS. 6 and 7, the buffer tray 800 also includes an air position-aligning unit 850 connected to the tray main body 810, the air position-aligning unit 850 applying air having predetermined or preset pressure to the semiconductor package to be received in the package pocket portion 812, thereby aligning semiconductor packages in the package pocket portion 812. In this embodiment, when the air position-aligning unit 850 applies the air to the semiconductor package, the semiconductor package vibrates, resulting in an alignment in the package pocket portion 812.

The tray main body 810 forms an outer appearance of the buffer tray 800. The tray main body 810 may have an integrated block structure, i.e., a single structure as necessary. In embodiments, where the tray main body 810 is formed as the integrated block structure, a shock may be applied to the semiconductor package when the semiconductor package is received in the package pocket portion 812.

Accordingly, in order to absorb the shock applied to the semiconductor package when the semiconductor package is accommodated in the package pocket portion 812, the tray main body 810 includes a body portion 820 provided in a lower portion of the package pocket portion 812 and formed with a receiving groove 822, and a package supporter 830 arranged in the receiving groove 822 of the body portion 820 that provides a support for the semiconductor package received in the package pocket portion 812.

Further, the package supporter 830 includes a package supporting frame 831 relatively movably coupled to the body portion 820 and a shock-absorbing member 835 interposed between the body portion 820 and the package supporting frame 831. The shock-absorbing member 835 is constructed and arranged to absorb a shock applied to the package supporting frame 831.

In some embodiments, a spring may be used as the shock-absorbing member 835, and the package supporting frame 831 can include the spring installation groove 832 recessed to receive the spring. In some embodiments, the spring installation groove 832 is formed coaxially with the air channel 860, but not limited thereto. Alternatively, the spring installation groove 832 may be spaced apart from the air channel 860 and formed in the package supporting frame 831. The number of spring installation grooves may vary without limitation.

Further, the package supporting frame 831 may be formed of the same material as the body portion 820 or formed of a different material than the body portion 820.

With this configuration, during operation when the semiconductor package is received in the package pocket portion 812, the package supporter 830 may absorb a shock for safe seating with respect to semiconductor packages. Particularly, in this embodiment, if air is applied to a semiconductor package by the air position-aligning unit 850, then the semiconductor package vibrates. Notwithstanding the possibility of collisions occurring between the semiconductor package and the package supporter 830, such vibration can absorb the shock.

Also, each package pocket portions 812 can include an inclined surface 821 on an inner wall forming the package pocket portion 812 so that its cross-section area can gradually narrow from a top opening to a bottom surface. Thus, when the semiconductor package is received in the package pocket portion 812, the semiconductor package can enter along the inclined surface 821 despite the possibility of misalignment, for example, in cases where the semiconductor package moves slightly awry.

The air position-aligning unit 850 can include at least one air injection hole 852 formed in the tray main body 810, i.e., in the package supporting frame 831 of the package supporter 830. The air position-aligning unit 850 can also include an air channel 860 provided in the tray main body 810 and communicating with the air injection hole 852, an air pump (not shown) supplying air to the plurality of air channels 860, and a controller (not shown) for controlling the air pump to continuously supply air to the air channel 860 according to a predetermined time so that the semiconductor package can vibrate when the semiconductor packages to be tested are loaded in the tray main body 810.

In an embodiment, the air injection hole 852 is formed in the tray main body 810 and is provided in every package pocket portion 812 to communicate with each package pocket portion 812, for aligning the semiconductor package anywhere in the package pocket portion 812.

In an embodiment, the air injection holes 852 of the plurality of package pocket portion 812 are as shown in FIG. 5 connected to one air channel 860, but not limited thereto. Alternatively, each region may be divided and the air channel may be provided in every divided region to simultaneously supply air.

In an embodiment, an air injection hole 852 is provided in a center region of a bottom wall of the tray main body 810 forming the package pocket portion 812. The air injection hole 852 is provided in this manner because the semiconductor packages can be more efficiently aligned when the air injection hole 852 is provided in the center region of the bottom wall of the tray main body 810, but not limited thereto. Alternatively, the air injection hole 852 may be provided in regions other than the center region of the bottom wall of the tray main body 810 as long as the semiconductor packages are at least substantially aligned.

Thus, in embodiments where the air injection hole 852 is provided in the center region of the bottom wall of the tray main body 810 and injects a relatively very small amount of air upward, the semiconductor package can be vibrated (shaken) while slightly floating off within the package pocket portion 812, for example, shown in FIG. 6 and FIG. 7. At this time, if the semiconductor package goes awry or otherwise becomes misaligned, it can return to a proper position during operation. Also, a movable range of the semiconductor package can be restricted within the package pocket portion 812, and thus the semiconductor package can be more precisely aligned than a conventional case.

In an embodiment, the air injected through the air injection hole 852 of each package pocket portion 812 has the same pressure. Therefore, the air injection hole 852 formed in the bottom wall of the tray main body 810 forming the package pocket portion 812 in accordance with the air channel 860 may have the same size or related configuration, or the package pocket portions 812 may be different in the size or related configuration of the air injection hole 852 in accordance with distances from an air inlet 861. In this manner, air can be injected with the same pressure even though it is further distant from the air inlet 861 of the air channel 860.

Further, a diffusion groove 834 can be formed around the air injection hole 852 on the bottom wall of the tray main body 810. The diffusion groove 834 can be recessed with respect to the surface to communicate with the air injection hole 852 and has a cross-sectional area that is reduced as it extends in an upward direction. This is to diffuse the air from the air injection hole 852 to a predetermined region, thereby preventing the air from being intensively applied to the semiconductor package.

In this embodiment, the controller controls the air pump to continuously supply air to the air channel 860 by a relatively short time so that the semiconductor package can vibrate when the semiconductor packages to be tested are loaded in the tray main body 810. Like this, the semiconductor package may vibrate and thus be automatically aligned in the package pocket portion 812.

In this embodiment, the controller does not ascertain whether the semiconductor package is properly aligned in the package pocket portion 812, and controls the air pump to continuously supply air to the air injection hole 852 by a relatively short time. This is because the time for supplying the air is so short that the air is directly provided when the semiconductor package is loaded in the buffer tray 800, thereby not only aligning the semiconductor package going awry, but also more precisely aligning the semiconductor package as compared to that of a conventional case even though the semiconductor package does not go awry.

In this embodiment, the controller controls the air pump to continuously supply air to the air injection hole 852 by a relatively short time, but not limited thereto. Alternatively, the air pump may be controlled to discontinuously supply air as long as the semiconductor package is effectively aligned.

Figure 8:
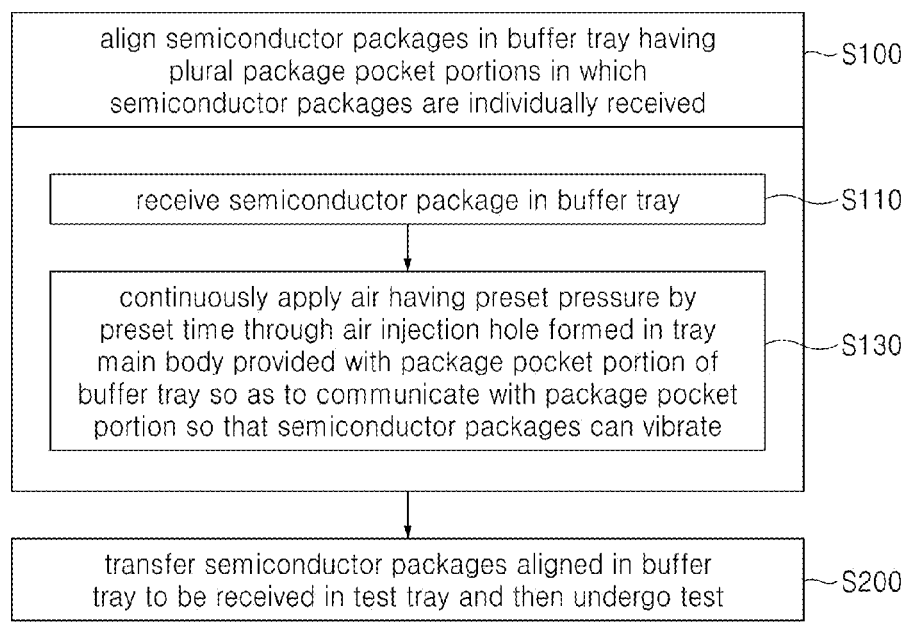
FIG. 8 is a flowchart for a test method of the semiconductor packages according to an embodiment of the present inventive concept.

A method of aligning the semiconductor package according to an embodiment of the present inventive concept and a test method for the semiconductor package using the same will now be described with reference to FIG. 8 in addition to FIG. 1 to FIG. 7.

At step S100, a semiconductor package is aligned in the buffer tray 800 having the plurality of package pocket portions 812 individually receiving the semiconductor package, and step S200 refers to a transferring and testing the aligned semiconductor package.

The step S100 of aligning the semiconductor package in the buffer tray 800 includes a set of steps. In particular, step S100 includes a step S110 of receiving the semiconductor package in the buffer tray 800, and a step S130 of applying air having a predetermined pressure to the semiconductor package received in the package pocket portion 812 in order to align the semiconductor package.

In more detail, one customer tray 630 stocked on the loading stocker is transferred to the loading-side set plate by the transfer arm. A plurality of semiconductor packages on the customer tray 630 are loaded into the respective package pocket portions 812 of the buffer tray 800 by the loading Cartesian robot (S110).

When the plurality of semiconductor packages are loaded into the respective package pocket portions 812 of the buffer tray 800, the semiconductor package may go awry with respect to the buffer tray 800. It may be ascertained whether the semiconductor package goes awry. However, in this embodiment, when the plurality of semiconductor packages are loaded into the respective package pocket portions 812 of the buffer tray 800, air having the predetermined pressure is injected to the whole package pocket portions 812 via the air injection hole 852 according to a predetermined time without ascertaining whether the semiconductor package goes awry.

The air injected to the air injection hole 852 collides with the semiconductor package loaded into each package pocket portion 812, so that the semiconductor package vibrates, thereby aligning the semiconductor package (S130).

Then, at step S200, the aligned semiconductor package is transferred and tested. In more detail, when the semiconductor package is aligned in the buffer tray 800, the second pickup head loads the semiconductor package from the buffer tray 800 to the test tray 330.

The test tray 330 loaded with a plurality of semiconductor packages is transferred to the soak chamber and heated or cooled at a temperature for the test conditions, thereby being transferred to the test chamber.

In the test chamber, the plurality of semiconductor packages on the test tray 330 are connected to test sockets, thereby performing the test. Then, the tested test tray 330 is transferred to the exit chamber 400.

The test tray 330 returns to a room temperature while passing through the exit chamber 400, and is sorted with regard to grades by the unloading Cartesian robot 720 in accordance with test results. The test tray 330 is then moved to the customer tray 630 placed in the unloading-side set plate 710.

If the empty customer tray 630 placed in the unloading-side set plate 710 is fully occupied with the semiconductor packages, then the customer tray 630 is transferred to and stocked in the unloading stocker by the transfer arm in accordance with various grades. Then, the transfer arm transfers a new empty customer tray 630 to the unloading-side set plate 710.

Figure 9:
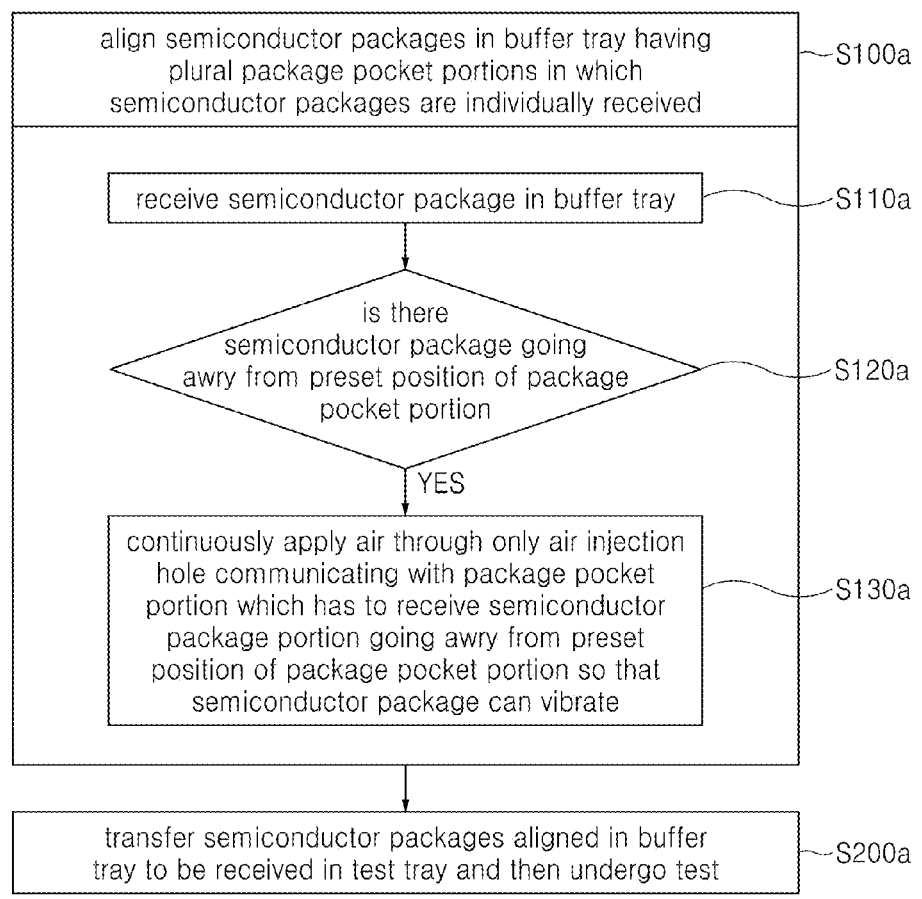
FIG. 9 is a flowchart for a test method of the semiconductor packages according to another embodiment of the present inventive concept.

FIG. 9 is a flowchart for a test method of the semiconductor packages according to another embodiment of the present inventive concept. Here, a method of aligning the semiconductor package according to this embodiment of the present inventive concept and a test method for the semiconductor package using the same will be described with regard to only different parts from those of FIG. 8.

In this embodiment, at step S100a, the semiconductor package is aligned in the buffer tray 800. Step S100a includes ascertaining whether there is a semiconductor package going awry from a preset position of the package pocket portion 812 (S120a), and aligning the semiconductor package by applying air to only the air injection hole 852 communicating with the package pocket portion 812 from which the semiconductor package goes awry. Thus, a step of vibrating the semiconductor package (S 130a) occurs, as distinguished from the foregoing embodiment. However, a step S110a of receiving the semiconductor package in the buffer tray 800, and a step S200a of transferring and testing the aligned semiconductor package are the same as those of the foregoing embodiment.

Meanwhile, the foregoing embodiments illustrate that the buffer tray 800 is used as the tray for aligning the semiconductor packages, but not limited thereto. Alternatively, the tray for aligning the semiconductor packages may be applied to the test tray 330.

According to embodiments of the inventive concept, the semiconductor package that may sometimes go awry while the semiconductor packages are individually transferred can be aligned to a proper position, and degree of precision in the proper position of the package can be more improved than that of a conventional case.

While the inventive concept has been particularly shown and described with reference to exemplary embodiments thereof, it will be understood that various changes in form and details may be made therein without departing from the spirit and scope of the following claims.

What is claimed is:

1. A tray for aligning semiconductor packages, the tray comprising:
    a tray main body comprising a plurality of package pocket portions at which a plurality of semiconductor packages are individually received; and
    an air position-aligning unit coupled to each of the plurality of package pocket portions of the tray main body, the air position-aligning unit applying air having a preset pressure to a semiconductor package of the plurality of semiconductor packages received at a package pocket portion of the plurality of package pocket portions, wherein the semiconductor package is aligned at the package pocket portion by the application of air by the air position-aligning unit directly to the semiconductor package in the package pocket portion.

2. The tray according to claim 1, wherein the air position-aligning unit comprises
    an air channel in the tray main body that communicates with the package pocket portion and is provided in the tray main body to connect with an air injection hole for injecting the air; and
    an air pump that supplies the air to the air channel.

3. The tray according to claim 2, wherein the air injection hole is provided at a center region of a bottom wall of the tray main body and receives the air from the air position-aligning unit.

4. The tray according to claim 3, further comprising a diffusion groove which is recessed from a surface about the air injection hole at the bottom wall, the diffusion groove communicating with the air injection hole, the diffusion groove having a cross-section area that is reduced it extends upward.

5. The tray according to claim 2, wherein the air injection hole is connected to one air channel.

6. The tray according to claim 2, wherein the air position-aligning unit further comprises a controller which controls the air pump to continuously supply air by a preset time to the air channel when the semiconductor packages to be tested are loaded into the tray main body, so that the semiconductor packages can vibrate.

7. The tray according to claim 1, wherein the tray main body comprises:
    a body portion which comprises the package pocket portion and a receiving groove formed in a lower portion of the package pocket portion; and
    a package supporter which is arranged in the receiving groove of the body portion, and supports the semiconductor package received in the package pocket portion, and
    the air injection hole is formed in the package supporter.

8. The tray according to claim 7, wherein the package supporter comprises:
    a package supporting frame which is relatively movably coupled to the body portion; and
    a shock-absorbing member, which is interposed between the body portion and the package supporting frame and absorbs a shock applied to the package supporting frame.

9. The tray according to claim 1, wherein the plurality of package pocket portions each comprises an inclined surface on an inner wall of the tray main body forming the package pocket portion so that a cross-section area of each package pocket portion gradually narrows as it extends from a top opening to a bottom surface.

10. The tray according to claim 1, further comprising a buffer tray which is transferred from a customer tray loaded with the semiconductor packages to be tested and that receives the semiconductor packages.

11. A test handler comprising:
    a tray for aligning semiconductor packages, in which the semiconductor packages are received, the tray comprising:
        a tray main body comprising a plurality of package pocket portions in which semiconductor packages are individually received; and
        an air position-aligning unit coupled to each of the plurality of package pocket portions of the tray main body, the air position-aligning unit applying air having a preset pressure to a semiconductor package received in the package pocket portion so that the semiconductor package can be aligned in the package pocket portion by the application of air by the air position-aligning unit directly to the semiconductor package in the package pocket portion.

12. The test handler according to claim 11, wherein the air position-aligning unit comprises:
    at least one air injection hole in the tray main body;
    an air channel in the tray main body, the air channel communicating with the at least one injection hole for injecting the air; and
    an air pump which supplies the air to the air channel so that the semiconductor package can vibrate when the semiconductor packages to be tested are loaded in the tray main body.

13. The test handler according to claim 12, wherein the air injection hole is provided in a center region of a bottom wall of the tray main body forming the package pocket portion.

14. The test handler according to claim 13, further comprising a diffusion groove which is recessed from a surface around the air injection hole of the bottom wall to communicate with the air injection hole, and has a cross-section area getting smaller as going upward.

15. The test handler according to claim 12, wherein the air position-aligning unit further comprises a controller which controls the air pump to continuously supply air by preset time to the air channel when the semiconductor packages to be tested are loaded into the tray main body, so that the semiconductor packages can vibrate.

16. The test handler according to claim 11, wherein the tray main body comprises:

a body portion which comprises the package pocket portion and a receiving groove formed in a lower portion of the package pocket portion; and a package supporter which is arranged in the receiving groove of the body portion, and supports the semiconductor package received in the package pocket portion, and the air injection hole is formed in the package supporter.

17. The test handler according to claim 16, wherein the package supporter comprises:

a package supporting frame which is relatively movably coupled to the body portion; and a shock-absorbing member which is interposed between the body portion and the package supporting frame and absorbs a shock applied to the package supporting frame.

18. The test handler according to claim 11, wherein the plurality of package pocket portions each comprises an inclined surface on an inner wall of the tray main body forming the package pocket portion so that a cross-section area of each package pocket portion can get gradually narrower as going from a top opening to a bottom surface.

19. The test handler according to claim 11, comprising a buffer tray which is transferred from a customer tray loaded with the semiconductor packages to be tested and receives the semiconductor packages.

20. A test handler, comprising:

a buffer tray that aligns a plurality of semiconductor packages to be tested, the buffer tray comprising:

a tray main body having a plurality of package pocket portions in which the semiconductor packages are individually received; and an air position-aligning unit coupled to each of the plurality of package pocket portions of the tray main body, the air position-aligning unit applying air to each of the semiconductor packages to be received in the package pocket portions for aligning semiconductor packages in the package pocket portions by the application of air by the air position-aligning unit directly to the semiconductor package in the package pocket portion; and a loader unit that transfers the semiconductor packages from the buffer tray to a test tray.

21. The test handler according to claim 20, wherein the air position-aligning unit comprises:

an air channel in the tray main body that communicates with the package pocket portion and is provided in the tray main body to connect with an air injection hole for injecting the air; and an air pump that supplies the air to the air channel.

22. The test handler according to claim 20, wherein the air position-aligning unit further comprises a controller which controls the air pump to continuously supply air by preset time to the air channel when the semiconductor packages to be tested are loaded into the tray main body, so that the semiconductor packages can vibrate.

23. The test handler according to claim 20, wherein the tray main body comprises:

a body portion which comprises the package pocket portion and a receiving groove formed in a lower portion of the package pocket portion; and a package supporter which is arranged in the receiving groove of the body portion, and supports the semiconductor package received in the package pocket portion, and the air injection hole is formed in the package supporter.

24. The test handler according to claim 20, wherein the plurality of package pocket portions each comprises an inclined surface on an inner wall of the tray main body forming the package pocket portion so that a cross-section area of each package pocket portion can get gradually narrower as going from a top opening to a bottom surface.

\* \* \* \* \*